United States Patent
Rogozine

(10) Patent No.: US 7,619,496 B2
(45) Date of Patent: Nov. 17, 2009

(54) MONOBLOCK RF RESONATOR/FILTER HAVING A CONDUCTIVE TRANSMISSION LINE CONNECTING REGIONS OF CONDUCTIVE MATERIAL

(75) Inventor: Alexandre Rogozine, Rio Rancho, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 11/977,276

(22) Filed: Oct. 24, 2007

(65) Prior Publication Data

US 2008/0100402 A1    May 1, 2008

Related U.S. Application Data

(60) Provisional application No. 60/854,798, filed on Oct. 27, 2006.

(51) Int. Cl.
*H01P 1/205* (2006.01)
*H01P 1/213* (2006.01)

(52) U.S. Cl. .................... 333/206; 333/134
(58) Field of Classification Search .............. 333/202, 333/206, 134
See application file for complete search history.

(56) References Cited

U.S. PATENT DOCUMENTS

| | | | |
|---|---|---|---|
| 4,431,977 A | 2/1984 | Sokola et al. | |
| 5,130,682 A | 7/1992 | Agahi-Kesheh | |
| 5,162,760 A | 11/1992 | Phillips et al. | |
| 5,349,315 A | 9/1994 | Ala-Kojola | |
| 5,602,518 A | 2/1997 | Clifford, Jr. et al. | |
| 5,731,746 A | 3/1998 | Sokola et al. | |
| 5,745,018 A | 4/1998 | Vangala | |
| 5,905,420 A | 5/1999 | Tsujiguchi et al. | |
| 5,994,978 A | 11/1999 | Vangala | |
| 6,204,738 B1 * | 3/2001 | Toda et al. | 333/206 |
| 6,549,095 B2 * | 4/2003 | Tsukamoto et al. | 333/134 |
| 6,801,106 B2 * | 10/2004 | Ono et al. | 333/206 |
| 6,879,222 B2 | 4/2005 | Vangala et al. | |

FOREIGN PATENT DOCUMENTS

EP    0 951 089    10/1999

OTHER PUBLICATIONS

La Casta Munoa, S, PCT International Search Report mailed Jul. 2, 2008 re: International Application No. PCT/US2007/022556 filed Oct. 24, 2007.
La Casta Munoa, S, PCT Written Opinion of the International Searching Authority mailed Jul. 2, 2008 re: International Application No. PCT/US2007/022556 filed Oct. 24, 2007.

* cited by examiner

*Primary Examiner*—Benny Lee
(74) *Attorney, Agent, or Firm*—Daniel J. Deneufbourg

(57) ABSTRACT

A resonator/filter adapted for direct surface mounting to the surface of a printed circuit board. The resonator/filter comprises a block of dielectric material including at least one resonator through-hole extending therethrough and respective top, bottom and side surfaces defining respective regions of dielectric material covered with conductive material. The top block surface defines at least a first conductive region. A second conductive region on the bottom surface of the block defines an input/output contact which allows the filter to be mounted on the board with the bottom filter surface seated thereon, thus providing a direct ground contact between the board and the resonator through-hole for improved attenuation performance particularly at higher frequencies. A plurality of transmission line embodiments electrically interconnect the first and second conductive regions.

9 Claims, 8 Drawing Sheets

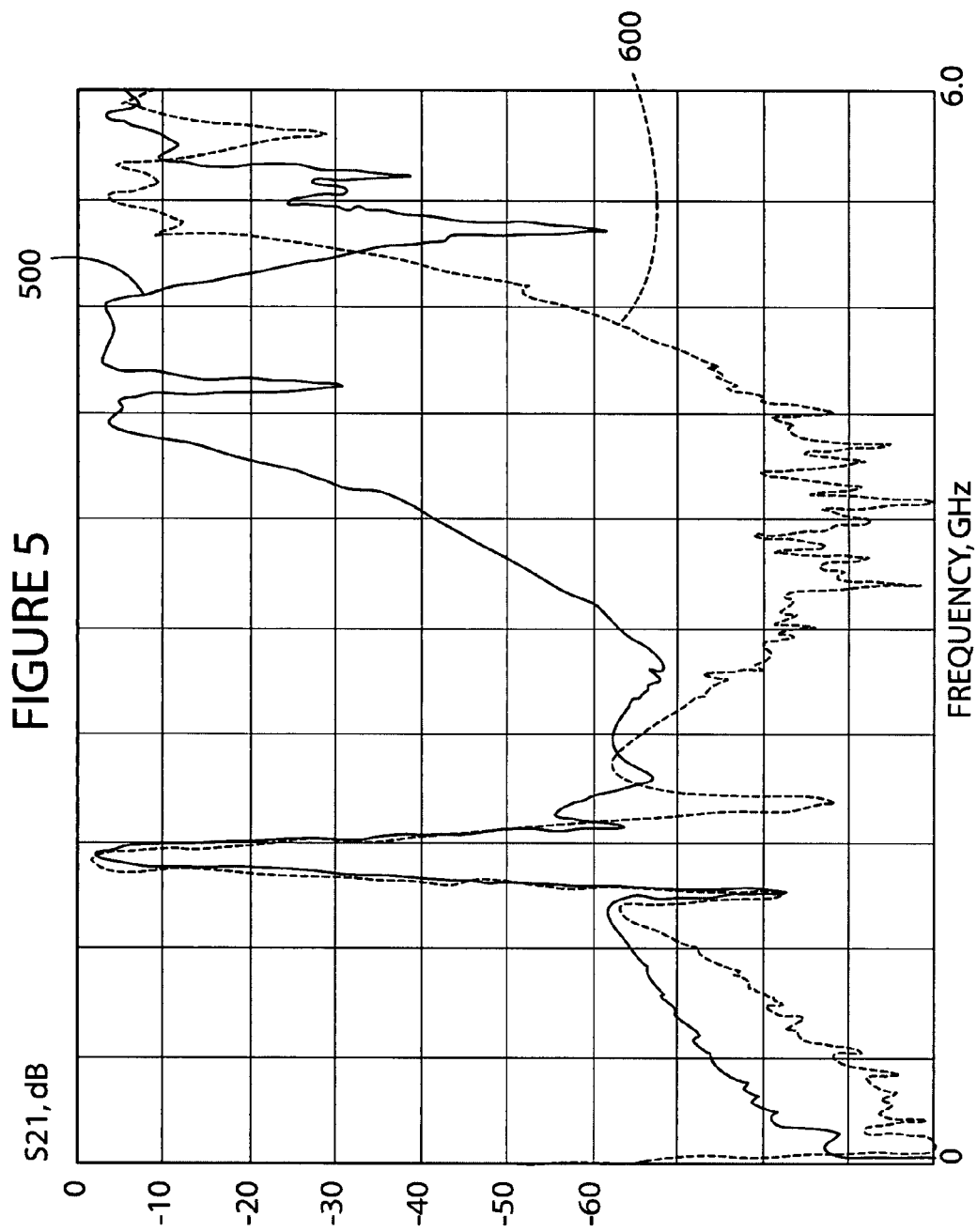

MONOBLOCK RF RESONATOR/FILTER HAVING A CONDUCTIVE TRANSMISSION LINE CONNECTING REGIONS OF CONDUCTIVE MATERIAL

CROSS-REFERENCE TO RELATED APPLICATION

This application claims the benefit of U.S. Provisional Application Ser. No. 60/854,798, filed on Oct. 27, 2006, the disclosure of which is explicitly incorporated herein by reference as are all references cited therein.

FIELD OF THE INVENTION

This invention relates generally to monoblock RF resonator and filter devices and, in particular, to an improved dielectric ceramic monoblock RF resonator and filter with input/output contacts defined on a bottom face of the resonator or filter and resonator through-holes disposed in an orientation generally normal to the mounting board.

BACKGROUND OF THE INVENTION

Ceramic dielectric block resonator devices such as, for example, ceramic dielectric block filters are well known in the electrical arts and at least one such ceramic filter is described in U.S. Pat. No. 5,162,760 entitled "Dielectric Block Filter with Isolated Input/Output Contacts". These blocks are relatively easy to manufacture, rugged, and relatively compact. In the basic ceramic block filter design as shown in U.S. Pat. No. 5,162,760, resonators are formed by cylindrical passages called through-holes which extend between opposed top and bottom surfaces of the block. The block is substantially plated with a conductive material (i.e., metallized) on all but one of its six (outer) sides and on the interior walls of the resonator through-holes.

The top surface is not fully metallized but instead bears a metallization pattern designed to couple input and output signals through the series of resonators. In the design of, for example, U.S. Pat. No. 5,162,760 and U.S. Pat. No. 5,745,018 to Vangala, the pattern extends to the sides of the block, where input/output electrodes or contacts are formed.

The reactive coupling between adjacent resonators and thus the performance of the device is dictated, at least in part, by the physical dimensions and number of resonators, by the orientation of the resonators relative to one another and the PC board to which the filter is adapted to be mounted, and by aspects of the top surface metallization pattern. These filters may also be equipped with an external metallic shield of the type disclosed in, for example, U.S. Pat. No. 5,745,018 to Vangala which is attached to and positioned across the open-circuited end of the block in order to minimize parasitic coupling between non-adjacent resonators and achieve acceptable stopbands.

Although such RF signal filters have received widespread commercial acceptance, efforts at improving this basic design and, more specifically, efforts at improving the frequency response of such filters outside their bandwidth, i.e., improved attenuation in the stopband, have continued to the present.

For example, in U.S. Pat. Nos. 5,162,760 and 5,745,018, the input/output contacts/pads are located on one of the side surfaces adjacent the top surface to allow the filter to be direct surface mounted on a printed circuit board in a relationship where the resonator through-holes are oriented parallel to the face of the printed circuit board to which the filter is adapted to be mounted. A disadvantage associated with this design, however, is the fact that it has a limited effect of attenuation in the stop band of the filter, mostly due to its asymmetrical excitation.

As another example, U.S. Pat. No. 5,130,682 discloses a filter where a special mounting bracket is used for suppressing unwanted signals. The bracket, however, does not allow for the tuning of the filter inasmuch as the pattern on the top surface of the filter is not accessible through the bracket.

The present invention is directed to an improved resonator/filter device as described in more detail below.

SUMMARY OF THE INVENTION

The present invention is directed to a resonator device adapted to be attached to the surface of a circuit board or substrate. The resonator device comprises a block of dielectric material defined by top, bottom, and side surfaces including selected regions covered with conductive material. Means are defined on the bottom surface of the block of dielectric material for capacitively electrically coupling the resonator device to the board or substrate. At least one resonator is defined by at least one through-hole extending between the top and bottom surfaces of the block.

In accordance with the invention, the at least one through-hole is oriented in a relationship generally normal to the surface of the mounting circuit board when the resonator device is attached to the circuit board in a relationship wherein the bottom surface of the block is coupled directly to the ground of the top surface of the printed circuit board, thus providing a direct ground coupling relationship between the at least one filter through-hole resonator and the printed circuit board.

The resonator device preferably defines at least a first region of conductive material on the top surface of the block and the means for capacitive electrical coupling of the resonator device to the board or substrate comprises at least a second region of conductive material located on the bottom surface. The second region defines an input/output contact/pad adapted for direct surface coupling with a corresponding input/output contact/pad on the surface of the printed circuit board.

A conductive transmission line extends between and electrically connects the first and second regions.

In one embodiment, the transmission line comprises a strip of conductive material extending along at least one of the side surfaces of the block between the first and second regions of conductive material.

In another embodiment, the at least one through-hole defines an aperture in the bottom surface of the block, the second region surrounds the aperture, and the transmission line between the first and second regions is defined by conductive material which covers the interior surface of the through-hole.

There are other advantages and features that will be more readily apparent from the following description of the invention, the drawings, and the appended exemplary claims.

BRIEF DESCRIPTION OF THE DRAWINGS

These and other features of the invention can best be understood by the following description and the accompanying FIGURES as follows:

FIGS. 4 and 5 are frequency response graphs showing the actual measured low band and high band performance characteristics of both a prior art filter and the resonator/filter devices in accordance with the present invention.

DETAILED DESCRIPTION OF THE PREFERRED EMBODIMENT

While this invention is susceptible to embodiment in many different forms, this specification and the accompanying FIGURES disclose only four forms of the resonator/filter device as examples of the invention. The invention is not intended to be limited to the embodiments so described, however. The scope of the invention is identified in the appended claims.

Figure 1:
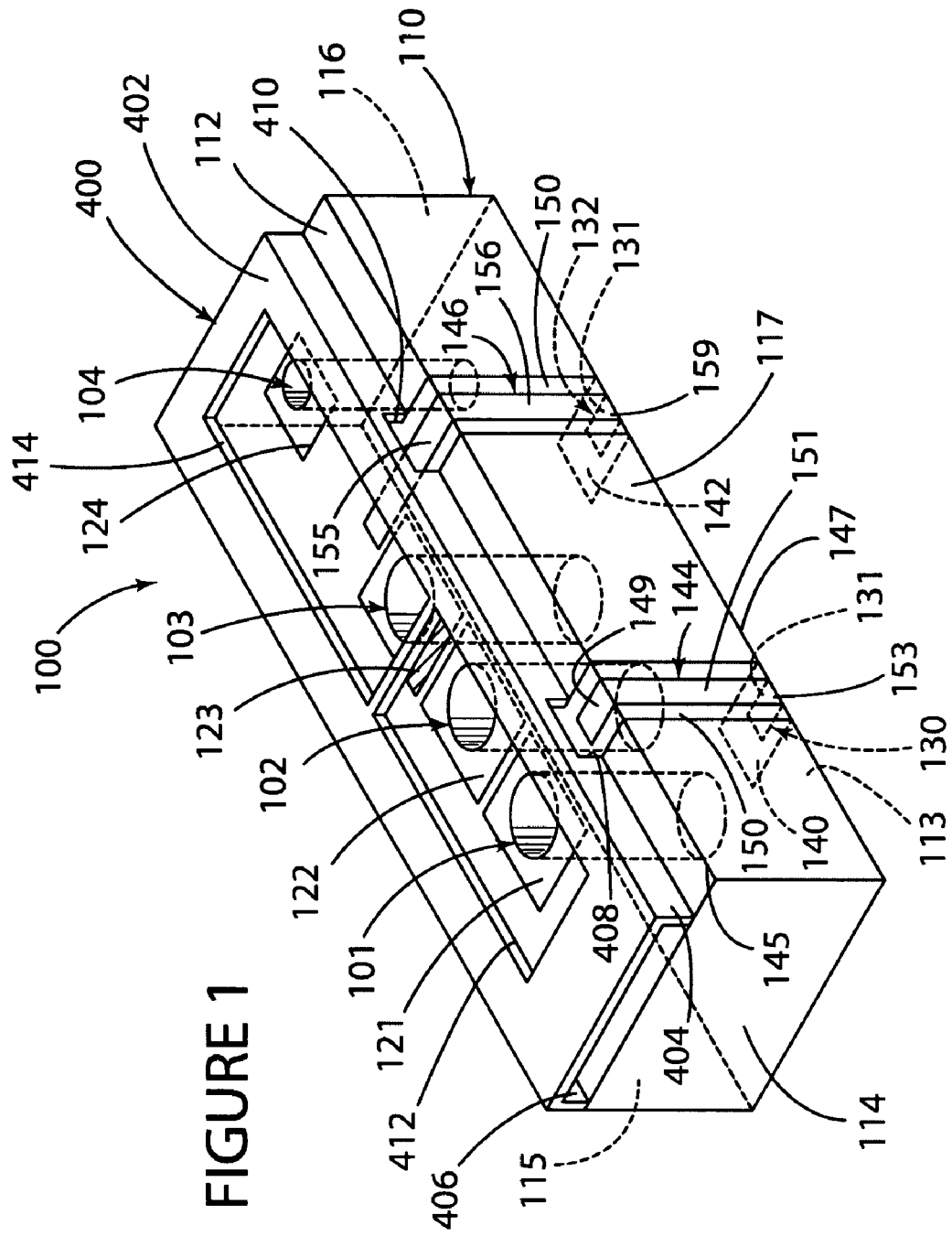
FIG. 1 is a simplified, enlarged, perspective view of a resonator device in the form of a filter incorporating the features of the present invention.

FIG. 1 shows one embodiment of a resonator/filter device in the form of a monoblock filter 100 which incorporates the features of the present invention. Filter 100 includes a block 110 which is composed of a dielectric material and is selectively plated with a conductive material as described in more detail below. Block 110 has a top surface 112, a bottom surface 113, an end side surface 114, a back side surface 115, an opposed end side surface 116, and a front side surface 117. Filter 100 can be constructed of any suitable dielectric material that has low loss, a high dielectric constant, and a low temperature coefficient.

The plating on block 110 is electrically conductive, preferably copper, silver or an alloy thereof. Such plating preferably covers all surfaces of the block 110 with the exception of portions of the top surface 112, bottom surface 113, and front surface 117, the plating of which is described in some detail below. Of course, other conductive plating arrangements can be utilized. See, for example, those discussed in "Ceramic Bandpass Filter," U.S. Pat. No. 4,431,977, Sokola et al., assigned to the present assignee and incorporated herein by reference to the extent consistent herewith.

In the embodiment of FIG. 1, block 110 includes four spaced-apart, generally parallel, through-holes 101, 102, 103, and 104, each extending through the block body from the top surface 112 to the bottom surface 113 thereof in a relationship generally normal to the top and bottom block surfaces 112 and 113 respectively. Through-holes 101, 102, 103, and 104 define respective interior walls which are plated with an electrically conductive material to define respective transmission line resonators comprised of short-circuited coaxial transmission lines with respective lengths selected for desired filter response characteristics.

For an additional description of the design, function, and purpose of the through-holes 101, 102, 103, and 104, reference maybe made to U.S. Pat. No. 4,431,977 to Sokola et al., supra. Although block 110 is shown with four plated through-holes 101, 102, 103, and 104, the present invention is not so limited and encompasses embodiments with only one through-hole and/or more than four through-holes depending upon the particular application.

The top surface 112 of block 110 is selectively plated with an electrically conductive material similar to the plating on block 110 to define, for example, the respective regions or plates 121, 122, 123, and 124 of conductive material surrounding each of the through-holes 101, 102, 103, and 104.

In accordance with this embodiment of the present invention, the selective plating includes at least a pair of spaced-apart, generally parallel input-output I/O contacts/pads 130 and 132 formed on the bottom surface 113. Each of the generally rectangularly-shaped I/O contacts/pads 130 and 132 is defined by a mesa of electrically conductive material 131 which is surrounded by respective generally rectangularly-shaped regions 140 and 142 of ceramic dielectric material, i.e., regions not covered with or including conductive material. I/O pads 130 and 132 extend generally inwardly and normally inwardly from the bottom edge 147 of block 110 which bridges bottom surface 113 and front surface 117. I/O pad 130 is generally co-linear with the bottom aperture of through-hole 101 and is located on the bottom surface 113 generally between the through-hole 101 and the edge of block 110 which bridges the front and bottom block surfaces 117 and 113 respectively. I/O pad 132 is diametrically opposed to I/O pad 130 and is located on the bottom surface 113 generally between the bottom apertures of through-holes 103 and 104.

Plates/regions 121, 122, 123, and 124 of conductive material on top block surface 112 capacitively couple the associated resonators of through-holes 101, 102, 103, and 104 to input/output I/O pads/contacts 130 and 132 on bottom block surface 113 through respective elongated, spaced-apart, parallel filter transmission lines 144 and 146 extending between the plates 121, 122, 123, and 124 at one end and the input/output I/O pads/contacts 130 and 132 at the other end.

In accordance with the present invention, transmission line 144 is defined by an elongate continuous unitary strip of conductive material which has a top end strip 149 which is located on the top block surface 112 in a spaced-apart and generally co-linear relationship relative to the plate/region 121 and wraps around the top edge 145 of block 110 which bridges the top and front surfaces 112 and 117 respectively; an elongate body strip 151, also generally co-linear with through-hole 101, which extends the width of front surface 117 in the direction of bottom surface 113 in an orientation generally normal to the top and bottom block surfaces 112 and 113; and a lower end strip 153 which bridges the bottom edge 147 of block 110 and terminates unitarily into the mesa 131 of I/O pad/contact 130 on bottom block surface 113. Transmission line or strip 144 is completely surrounded on all sides by a region 150 of ceramic dielectric material, i.e., a region not covered with or including conductive material.

In a like manner, transmission line 146 is defined by an elongate continuous and unitary strip of conductive material which has a top end strip 155 which is located on the top block surface 112 and extends generally in the space between the plates 123 and 124 respectively. Plates 123 and 124 and strip 155 are separated by regions of dielectric material. Strip 155 then wraps around the top edge 145 of block 110 and additionally defines an elongate body strip 156 extending the width of front block surface 114 between the top and bottom block edges 145 and 147 respectively. A lower end strip 159 bridges the bottom block edge 147 and terminates unitarily in the mesa 131 of I/O pad/contact 132 defined on the bottom face 113 of block 110. Transmission line 146 is likewise completely surrounded by a region of ceramic dielectric material 150.

Transmission lines 144 and 146 are disposed and oriented in a spaced-apart and generally parallel diametrically opposed relationship relative to each other. Each of the transmission lines 144 and 146, and the constituent parts thereof, extend along the respective block surfaces in a relationship and orientation generally normal to block edges 145 and 147.

Referring back to FIG. 1, filter 100 additionally comprises a metallic shield 400 which is mounted and seated over the top surface 112 of block 110 in a relationship wherein: the roof 402 of shield 400 is spaced from and parallel to the top block surface 112; a peripheral outer face of elongate front shoulder or flange 404 of shield 400 depends generally normally downwardly from the front edge of the roof 402 and is seated directly against and extends the length of the top block surface 112 in a relationship generally parallel to the front block edge 145 in a region of the block top surface 112 between the through-holes and the front edge 145; and the peripheral outer face of the elongate rear shoulder or flange 406 of shield 400 extends the length of block 110 and is seated directly against, and generally co-linear with, the back edge of the top block surface 112 which bridges the top and back block surfaces 112 and 115 respectively.

The front elongate flange 404 of shield 400 additionally defines a pair of recesses 408 and 410 which are located along the length thereof in a relationship overlying the respective top end strips 149 and 155 of respective transmission lines 144 and 146.

The roof 402 of shield 400 additionally defines a pair of generally rectangularly-shaped openings 412 and 414. Roof opening 412 overlies the top openings or apertures of respective resonator holes 101 and 102. Roof opening 414 overlies the top openings or apertures of respective resonator holes 103 and 104. Roof openings 412 and 414 advantageously allow access to the top surface of the block 110 and, more specifically, to the regions of conductive material 121-124 thereon for tuning or trimming of the filter.

Figure 1A:
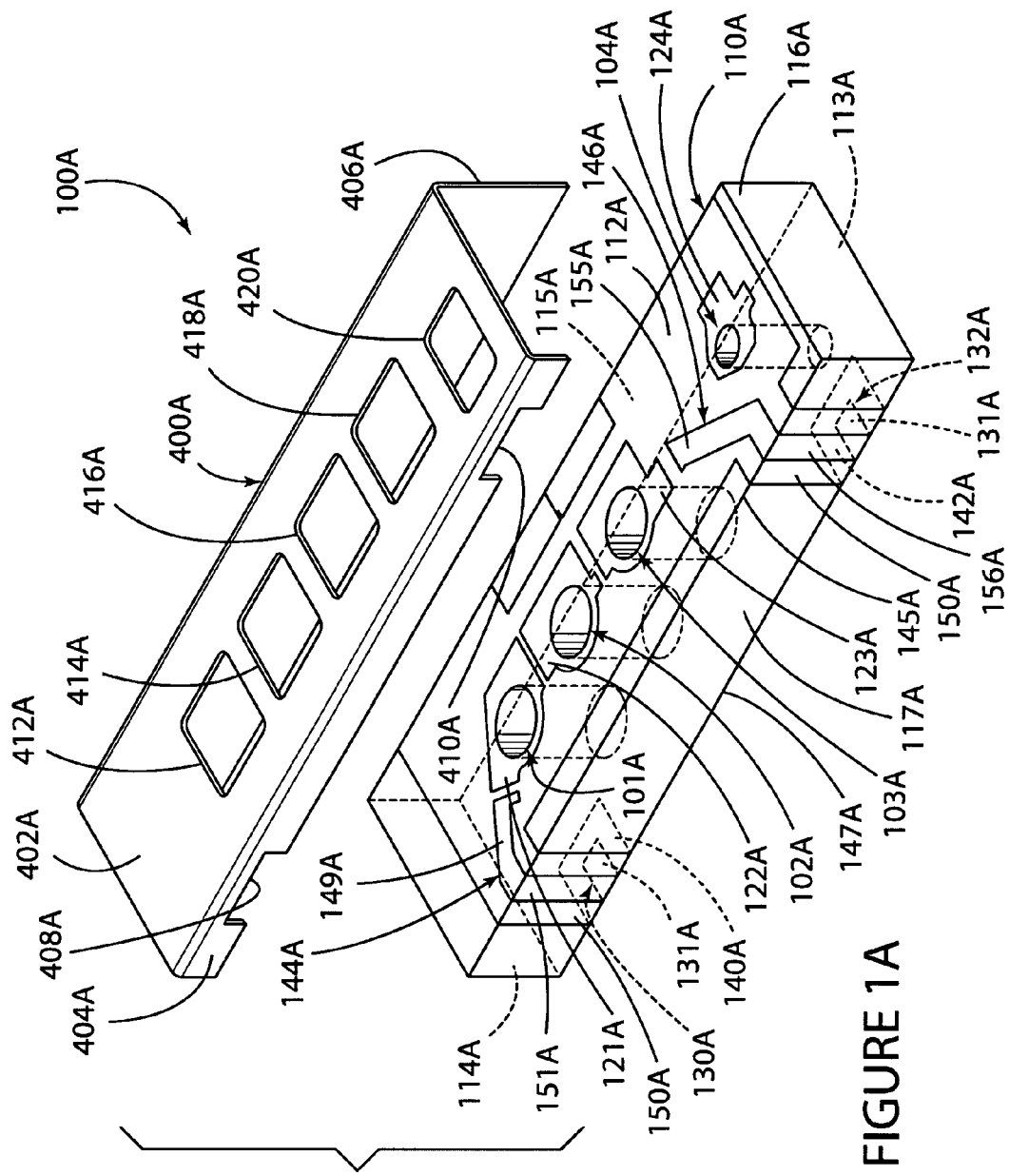
FIG. 1A is a simplified, enlarged, perspective view of a second embodiment of the filter shown in FIG. 1.

FIG. 1A shows a slightly different embodiment 100A of the filter 100 shown in FIG. 1.

Filter 100A is constructed of the same type of material as filter 100; includes a block 110A which is composed of the same type of dielectric material as block 100; and is selectively plated with the same type of conductive material as block 100. Block 110A has a top surface 112A, a bottom surface 113A, an end side surface 114A, a back side surface 115A, an opposed end side surface 116A, and a front side surface 117A.

The plating of filter 100A, like the plating of filter 100, preferably covers all surfaces of the block 110A with the exception of portions of the top surface 112A, bottom surface 113A, and front surface 117A.

Block 110A defines four spaced-apart, generally parallel, through-holes 101A, 102A, 103A, and 104A identical in form and operation to the respective through-holes 101-104 of filter 100, the description of which is thus incorporated herein by reference.

The top surface 112A of block 110A is selectively plated with an electrically conductive material to define plates 121A, 122A, 123A, and 124A of conductive material surrounding each of the through-holes 101A, 102A, 103A, and 104A.

Spaced-apart, generally parallel input-output I/O contacts/pads 130A and 132A are formed on the bottom surface 113A and are each defined by a mesa of electrically conductive material 131A which is surrounded by respective generally rectangularly-shaped regions 140A and 142A of ceramic dielectric material, i.e., regions not covered with or including conductive material.

I/O pad 130A is located on bottom block surface 113A generally between through-hole 101A and side block surface 114A. I/O pad 132A is located on bottom block surface 113A generally co-linearly with through-hole 104A. Both I/O pads 130A and 132A extend generally normally inwardly in a diametrically opposed relationship from the edge 147A which bridges front and bottom block surfaces 117A and 113A respectively.

Plates/regions 121A-124A of conductive material on top block surface 112A capacitively couple the associated resonators to the input/output I/O pads/contacts 130A and 132A on bottom block surface 113A through respective elongated, spaced-apart, parallel filter transmission lines 144A and 146A located and defined on the face of the block surfaces 112A and 117A and extending between the plates 121A-124A at one end and the input/output I/O pads/contacts 130A and 132A at the other end.

Transmission line 144A is defined by an elongate continuous and unitary strip of conductive material which is identical in all respects to transmission line 144 of filter 100 except that the transmission line 144A is located to the outside of through-hole 101A and includes a top end strip 149A located on the top block surface 112A which is bent relative to the elongate body strip 151A thereof inwardly in the direction of through-hole 101A and terminates short of the plated region 121A surrounding through-hole 101A. Body strip 151A extends the width of the front surface 117A between the top end strip 149A and terminates unitarily in the mesa 131A of I/O pad/contact 130A. The body strip 151A extends along the front block surface 117A in a relationship generally normal to block top edge 145A. Transmission line 144A is surrounded on all sides by a region 150A of ceramic dielectric material.

Transmission line 146A is defined by an elongate continuous and unitary strip of conductive material which is identical in all respects to transmission line 146 of filter 100 except that the transmission line 146A includes a top end strip 155A which is located on the top block surface 112A and is bent inwardly relative to the body strip 156A thereof in the direction of through-hole 103A. Elongate body strip 156A of transmission line 146A extends the width of the front surface 117A between the top end strip 155A and terminates unitarily in the bottom mesa 131A of I/O pad/contact 132A. Body 156A likewise extends along the front block surface 117A in a relationship generally normal to block edge 145A and in a relationship generally spaced from, parallel to, and diametrically opposed to, the body 151A of transmission line 144A.

Filter 100A additionally includes a shield 400A which is adapted to be mounted and seated over the top surface 112A of block 110A in a manner and relationship similar to shield 400 and thus the description above with respect to shield 400 is incorporated herein and applied to shield 400A as through fully set forth herein.

Shield 400A differs from shield 400 in that the roof 402A of shield 400A includes five separate, generally square-shaped openings 412A, 414A, 416A, and 418A, and 420A defined in the roof 402A which are adapted to overlie respective through-holes 101A, 102A, 103A; top end 155A of transmission line 146A; and through-hole 104A respectively. The respective openings are adapted to allow the respective conductive patterns, and thus the filter, to be trimmed and tuned.

Shield 400A likewise includes an elongate front flange or shoulder 404A which depends generally normally downwardly from the front edge of the roof 402A and includes a distal end face adapted to be seated against the top block surface 112A. A pair of recesses 408A and 410A are defined in regions of the shoulder 404A overlying the top ends 149A and 155A of the respective conductive transmission lines 144A and 146A.

Unlike shield 400, shield 400A comprises a generally rectangularly-shaped back wall 406A which depends generally normally downwardly from the back elongate edge of the roof 402A and includes an interior face adapted to be abutted against the back face 115A of block 110A when the shield 400A is appropriately positioned and mounted to the block 110A.

Figure 1B:
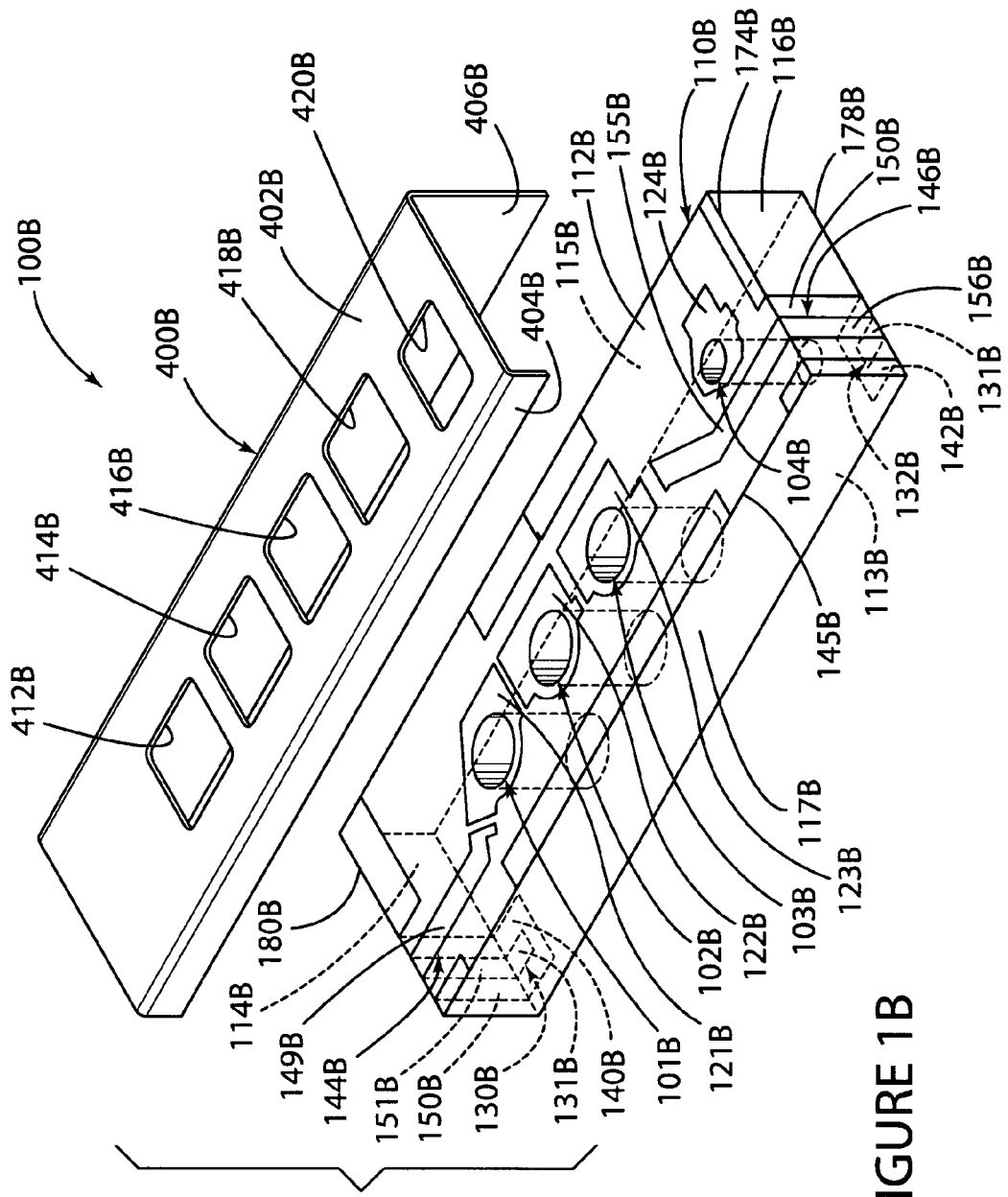
FIG. 1B is a simplified, enlarged, perspective view of a third embodiment of the filter shown in FIG. 1.

FIG. 1B shows yet another embodiment 100B of the resonator/filter device of FIG. 1 which likewise incorporates the features of the present invention.

Filter 100B includes a block 110B which, like the blocks defining the filters 100 and 100A, is composed of a dielectric material and is selectively plated with a conductive material as described above with respect to filters 100 and 100A, the description of which is thus incorporated herein by reference for filter 100B. Block 110B has a top surface 112B, a bottom surface 113B, an end side surface 114B, a back side surface 115B, an opposed end side surface 116B, and a front side surface 117B.

The plating on block 110B preferably covers all surfaces of the block 110B with the exception of portions of the top surface 112B, bottom surface 113B, and opposed side surfaces 114B and 116B, the plating of which is described in some detail below.

In the embodiment of FIG. 1B, block 110B defines four spaced-apart, generally parallel, through-holes 101B, 102B, 103B, and 104B, each extending through the block body from the top surface 112B to the bottom surface 113B thereof in a relationship generally normal to the top and bottom block surfaces 112B and 113B respectively. Through-holes 101B-104B define respective interior walls defining respective transmission line resonators comprised of short-circuited coaxial transmission lines with respective lengths selected for desired filter response characteristics.

The top surface 112B of block 110B defines respective regions or plates 121B, 122B, 123B, and 124B of conductive material surrounding each of the through-holes 101B-104B.

Input/output I/O contacts/pads 130B and 132B are formed on the bottom surface 113B. Each of the generally rectangularly-shaped I/O contacts/pads 130B and 132B is defined by a mesa of electrically conductive material 131B which is completely surrounded by respective generally rectangularly-shaped regions 140B and 142B of ceramic dielectric material, i.e., regions not covered with or including conductive material.

Unlike the I/O pads of filters 100 and 100A which extend inwardly from the edge of the block which bridges the bottom and front surfaces of the block, I/O pad 130B extends generally normally inwardly from the bottom edge of block 110B which bridges bottom and side surfaces 113B and 114B respectively while I/O pad 132B extends generally normally inwardly from the bottom edge of block 110B which bridges bottom and side surfaces 113B and 116B respectively.

In the embodiment shown, I/O pads 130B and 132B are diametrically and co-linearly opposed to each other.

Plates/regions 121B, 122B, 123B, and 124B of conductive material on top block surface 112B capacitively couple the associated resonators of through-holes 101B, 102B, 103B, and 104B to input/output I/O pads/contacts 130B and 132B on bottom block surface 113B through respective elongated, continuous, and unitary filter transmission lines 144B and 146B extending between and spaced from the plates 121B, 122B, 123B, and 124B at one end and the input/output I/O pads/contacts 130B and 132B at the other end.

Unlike the transmission lines associated with filters 100 and 100A which extend the width of the front block surface 117B, respective transmission lines 144B and 146B extend the width of respective opposed side block surfaces 114B and 116B as described below in more detail.

More specifically, transmission line 144B is defined by an elongate continuous strip of conductive material which has a top end strip 149B located on the top block surface 112B which extends in a spaced-apart relationship relative to the plate/region 121B and in a relationship generally parallel to and spaced from the front edge 145B of the block 110B bridging top and front surfaces 112B and 117B respectively. From the top block surface 112B, transmission line 144B, and more specifically, the top end strip 149B thereof, wraps around the top edge 180B of block 110B which bridges the top and side surfaces 112B and 114B and unitarily into elongate body strip 151B which extends the width of side surface 114B in the direction of bottom surface 113B in an orientation generally normal to the top and bottom block surfaces 112B and 113B, and a lower end strip which wraps around the bottom edge of block 110B which bridges side surface 114B and bottom surface 113B and terminates unitarily into the mesa 131B of I/O pad/contact 130B on bottom block surface 113B. Transmission line or strip 144B is surrounded on all sides by a region 150B of ceramic dielectric material, i.e., a region not covered with or including conductive material.

In a like manner, opposed transmission line 146B is defined by an elongate continuous strip of conductive material which has a top end strip 155B located on the top block surface 112 and extending between a point spaced from the conductive pad 123B in an orientation generally parallel to and spaced from the top edge 145B of block 110B which bridges the top and front block surfaces 112B and 117B respectively, then wraps around the top edge 174B of block 110B and additionally defines an elongate body strip 156B extending the width of side block surface 116B between the top and bottom block edges 174B and 178B respectively in a relationship normal thereto. The lower end of body strip 156B then wraps around the bottom block edge 178B and terminates unitarily in the mesa 131B of I/O pad/contact 132B defined on the bottom face 113B of block 110B. Transmission line or strip 146B is likewise surrounded on all sides by a region 150B of ceramic dielectric material.

Filter 100B additionally comprises a shield 400B which is identical in structure and function to shield 400A of filter 100A except that it does not include any recesses defined in the front flange 404B thereof. The discussion relative to shield 400A above is thus incorporated and applied to shield 400B as though fully set forth herein. Like numerals have thus been used in FIG. 1B to designate like elements. Briefly, and as shown in FIG. 1B, shield 400B includes a roof 402B; front and back downwardly depending flange 404B and wall 406B and respective openings 412B, 414B, 416B, 418B, and 420B defined in roof 402B.

It is further understood that, as described earlier in the Background of the Invention and shown in, for example, U.S. Pat. Nos. 5,162,760 and 5,745,018, the filters in use today incorporate input/output contacts/pads which are located on one of the side surfaces of the block which necessarily then requires the filter to be mounted to the board of a customer in a relationship wherein the filter resonator through-holes are not only oriented in a parallel relationship relative to the printed circuit board but, more importantly, in a spaced relationship from the printed circuit board. This has the disadvantage of creating an undesired indirect and lengthy connection and coupling of the filter resonators to the ground of the printed circuit board via the side surface thereof. This indirect and lengthy connection and coupling in turn causes undesired losses and imbalances in the electrical filter charges which, in turn, causes undesired waveguide propagations through the filter which cause undesirable filter responses and performance particularly at the higher frequencies above the passband.

Figure 3:
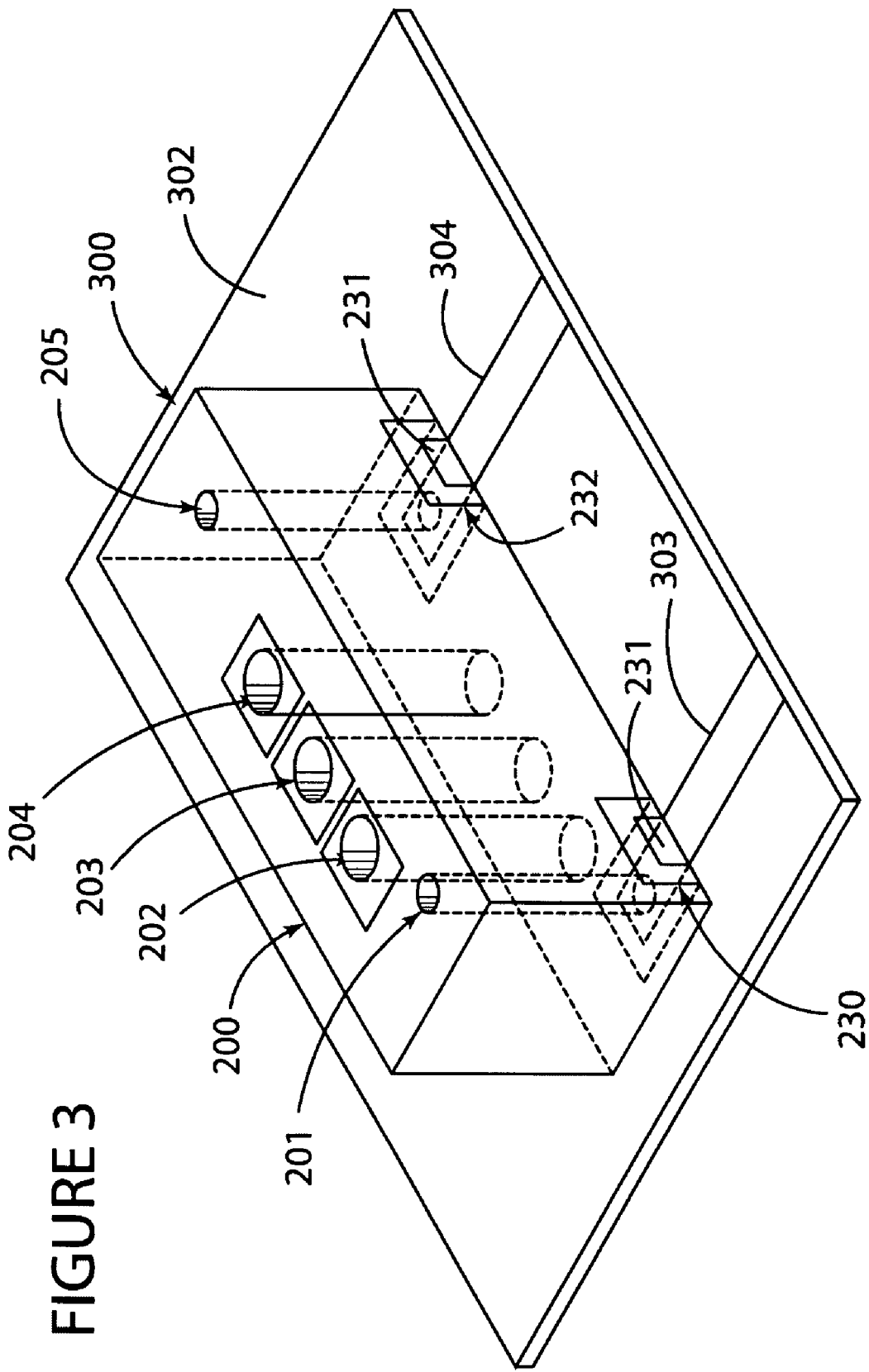
FIG. 3 is a simplified, enlarged perspective view of the filter of FIG. 2 mounted to the surface of a customer's printed circuit board.
Figure 3A:
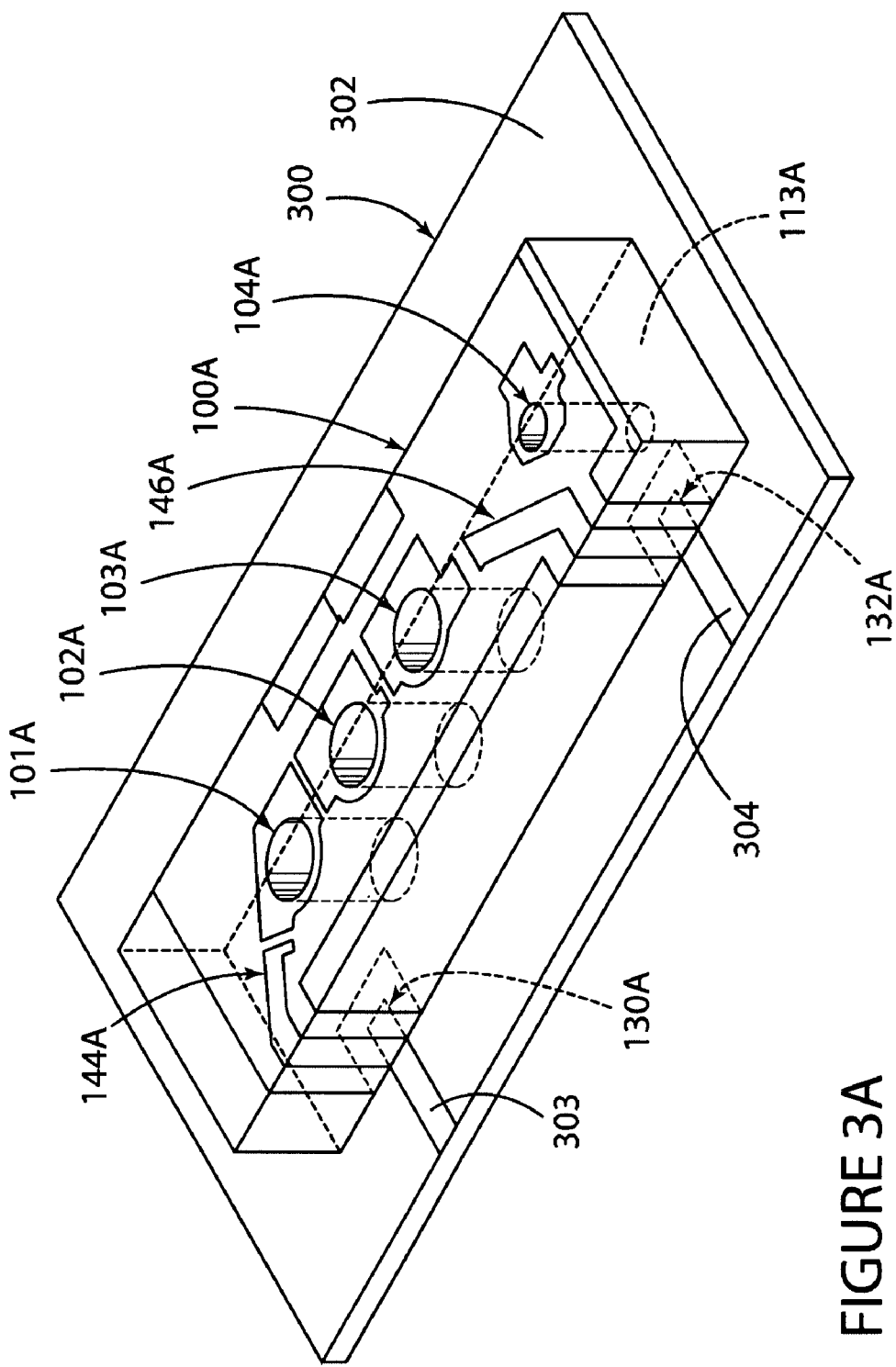
FIG. 3A is a simplified, enlarged, perspective view of the filter of FIG. 1A mounted to the surface of a customer's printed circuit board.

In accordance with the present invention, as shown in FIG. 3A with respect to filter embodiment 100A described below above including transmission lines 144A and 146A, it is understood that the placement of respective I/O pads 130A and 132A on the bottom surface 113A of filter 100A advantageously allows the filter 100A to be surface mounted to a customer's board 300 in a relationship wherein the bottom surface 113A is seated on the top face 302 of the board 300 with the I/O pads 130A and 132A in corresponding contact with respective I/O transmission lines 303 and 304 formed on the top face 302 of the board 300.

More importantly, the present invention allows the filter to be mounted to the board 300 in a relationship wherein the through-holes 101A, 102A, 103A, and 104A are oriented in a relationship generally normal or perpendicular to the top surface 302 of the board 300 and, more particularly, in a relationship wherein the ends of the resonator holes terminating in the bottom surface of the filter 100A are disposed in direct surface-to-surface contact with the top surface 302 of the board 300.

Figure 4:
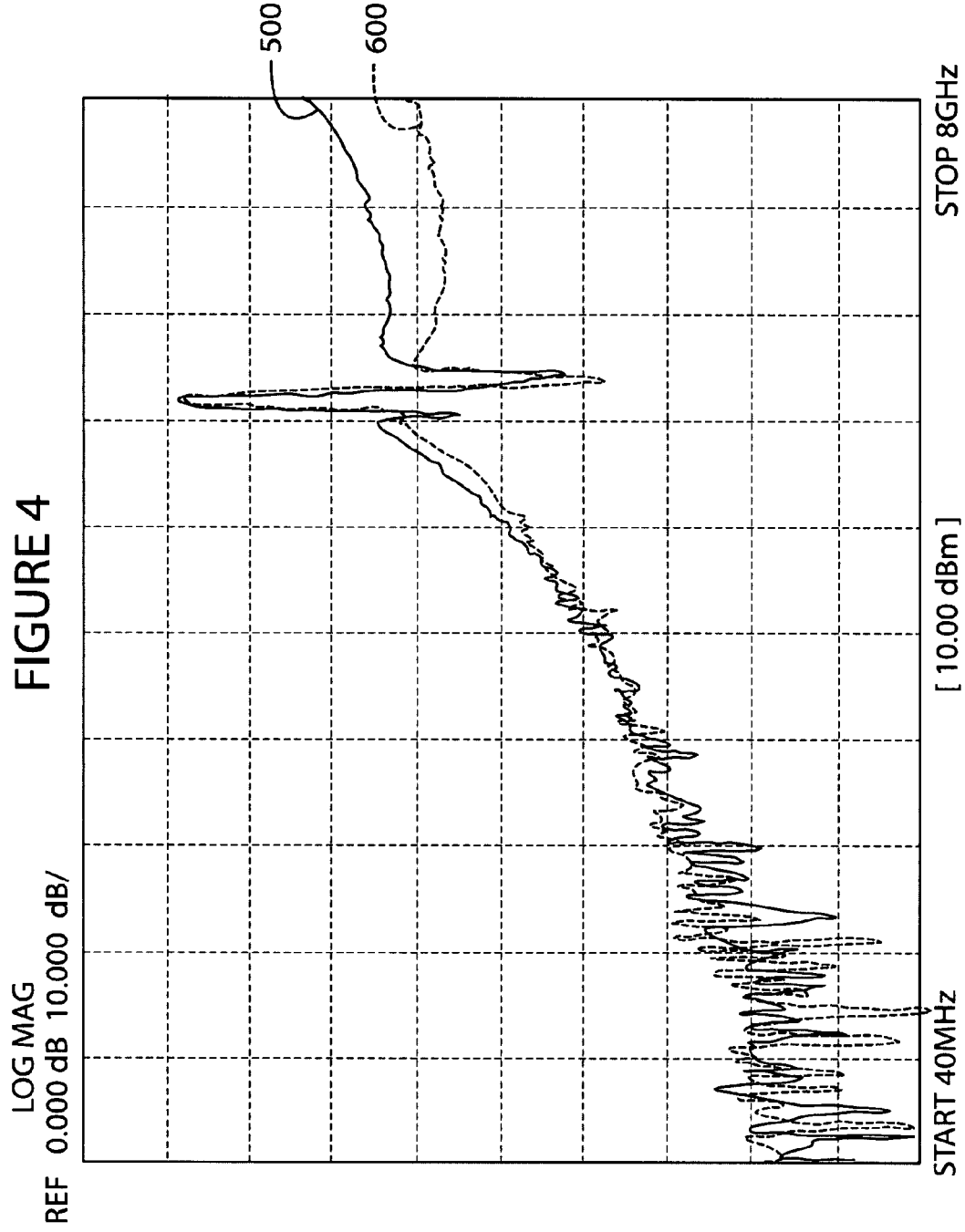

As described above, the present invention, which incorporates the use of input/output pads on the bottom, rather than the side face of the filter as described above allows the bottom surface of the filter (via direct contact with the resonator through-hole apertures) to be grounded directly to the top ground surface 302 of the board 300 which, in turn, necessarily connects all of the filter resonator through-holes directly to the ground of the board 300. This advantageously makes the grounding of resonators symmetrical, less resistive and inductive which, in turn, allows and provides for a greater and improved attenuation in the response of the filter at frequencies between the passband and the third harmonic as shown in FIGS. 4 and 5.

Referring back now to FIG. 2, there is shown therein yet another embodiment 200 of a resonator device in the form of a filter in accordance with the present invention.

Filter 200 includes a block 210 which, in the same manner as described above with respect to the block 110 of filter 100, is composed of a dielectric material which has been selectively plated with a conductive material as described in more detail below. Block 210 has a top surface 212, a bottom surface 213, an end side surface 214, a back side surface 215, an opposed end side surface 216, and a front side surface 217. Like filter 100, block 210 is preferably composed of a suitable dielectric material such as, for example, a ceramic material that has low loss, a high dielectric constant, and a low temperature coefficient.

Figure 2:
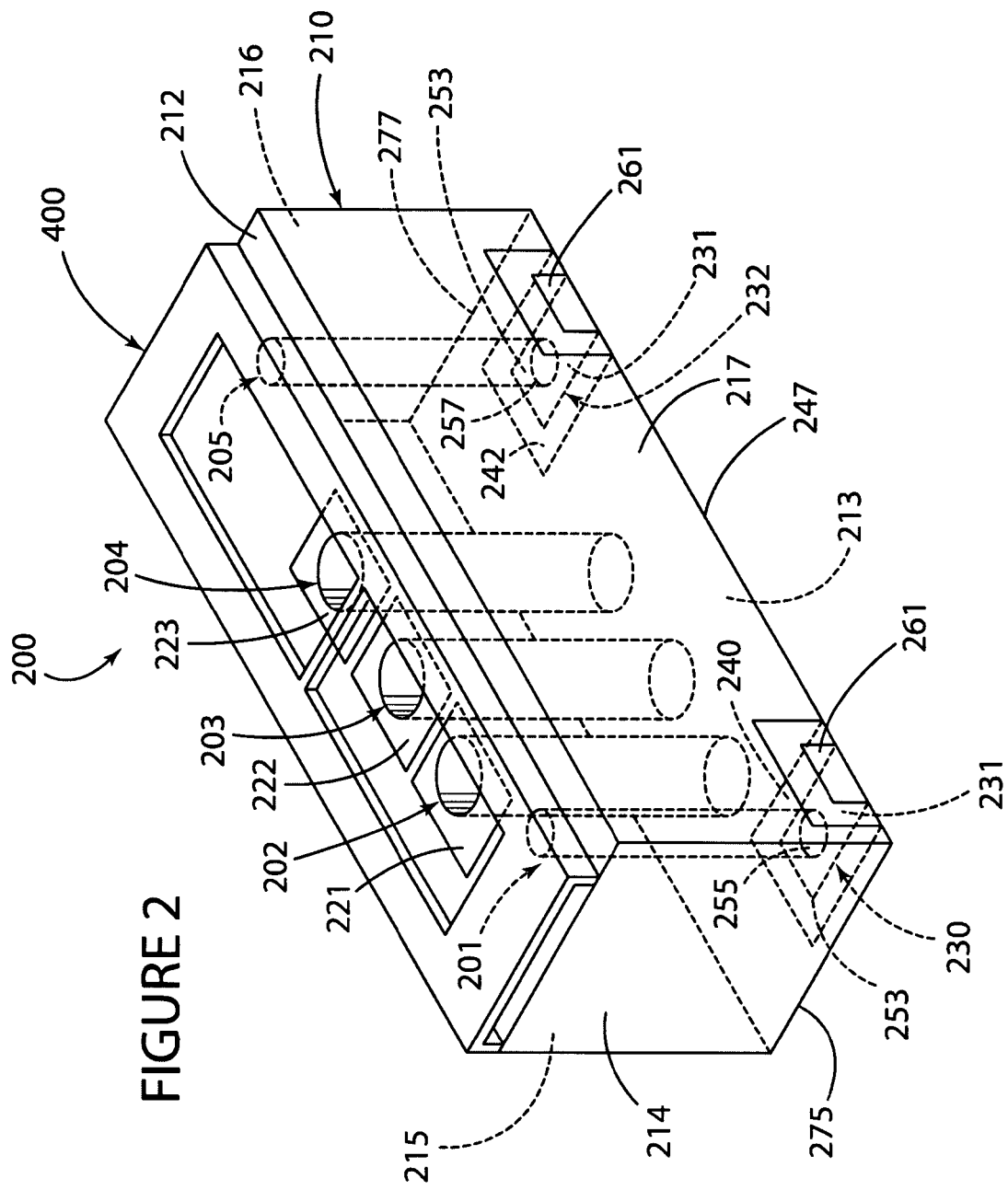
FIG. 2 is a simplified, enlarged, perspective view of yet a further embodiment of a resonator device in the form of a filter incorporating the features of the present invention.

The plating on block 210, like the plating on block 110, is electrically conductive, preferably copper, silver, or an alloy thereof. In the embodiment of FIG. 2, this plating preferably covers all surfaces of the block 210 with the exception of portions of the top surface 212, the bottom surface 213, and the front surface 217 as described in detail below.

In the embodiment of FIG. 2, block 210 defines five spaced-apart, parallel, through-holes 201, 202, 203, 204 and 205, each extending through the body of the block 210 from the top surface 212 to the bottom surface 213 thereof in a relationship generally normal to the top and bottom block surfaces 212 and 213 respectively. The interior wall of each of the through-holes 201-205 is plated with an electrically conductive material. In the same manner as through-holes 101-104 of filter 100, each of the through-holes 201-205 of filter 200 is essentially a transmission line resonator as described above with respect to filter 100 and in U.S. Pat. No. 4,431,977 to Sokola et al.

Through-holes 201 and 205 are oriented and located in a generally diametrically opposed relationship with the through-hole 201 being located adjacent the block side surface 214 and the through-hole 205 being located adjacent the opposed side block surface 216.

The top surface 212 of block 210 is selectively plated with an electrically conductive material similar to the plating on block 210. Specifically, it is noted that at least through-holes 202, 203 and 204 include respective regions or plates 221, 222 and 223 of conductive material surrounding the respective top apertures thereof for capacitively coupling the respective resonator through-holes 202, 203, and 204 as described in U.S. Pat. No. 4,431,977, supra.

In accordance with the present invention, the selective plating includes at least two I/O (input/output) contacts/pads 230 and 232 defined and formed on the bottom surface 213. I/O contacts/pads 230 and 232 are oriented in a spaced-apart generally parallel relationship relative to each other and in a generally normal inwardly extending relationship relative to the bottom edge 247 of block 210 which bridges the front and bottom block surfaces 217 and 213 respectively.

More specifically, I/O pads/contacts 230 and 232 are each defined by an elongate mesa or strip 231 of conductive material having a first end strip 253 which is defined on bottom surface 113 and surrounds respective bottom through-hole apertures 255 and 257 defined by through-holes 201 and 205 respectively; a body strip which wraps around the lower block edge 247 bridging the bottom and side surfaces 213 and 217 respectively, and a second opposed end strip 261 defined on side surface 217 adjacent edge 247.

Elongate I/O pad/contact 230 is positioned and oriented on the bottom surface 213 between and spaced from the sidewall 214 on one side and the bottom aperture of through-hole 202 on the opposite side in a relationship parallel to and spaced from the lower block edge 275 which bridges side surface 214 and bottom surface 213 and further in a relationship generally vertically co-planar and co-linear with through-hole 201.

Elongate I/O pad/contact 232 is positioned and oriented on the bottom surface 213 between and spaced from the side wall 216 on one side and the bottom aperture of through-hole 204 on the opposite side in a relationship parallel to and spaced from the lower block edge 277 which bridges side surface 216 and bottom surface 213 and further in a relationship generally vertically co-planar and co-linear with through-hole 205.

Each of the strips 231 of the respective I/O pads/contacts 230 and 232 is surrounded on all sides by respective regions 240 and 242 of ceramic dielectric material, i.e., regions not covered with or including conductive material.

In accordance with this embodiment of the present invention, through-hole resonators 201 and 205, and, more particularly, the bottom apertures thereof, terminate in the respective I/O contacts/pads 230 and 232 on bottom surface 213 and, more specifically, the respective strips 231 thereof so as to define respective electrical transmission lines between the respective strips 231 of I/O contact pads 230 and 232, the conductive material which covers the interior of through-holes 201 and 205, and thus the regions of conductive material on the top surface 212 of block 210.

Thus, in accordance with this embodiment of the present invention as depicted in FIG. 3, the use of I/O pads/contacts 230 and 232 on the bottom surface 213 (FIG. 2), in combination with respective transmission line through-holes 201 and 205 which couple respective I/O pads/contacts 230 and 232 with respective through-holes 201, 202, 203, 204, and 205 and regions 221, 222, and 223 on bottom surface 213 (FIG. 2), defines a filter 200 adapted to be mounted to the top surface 302 of the customer's printed circuit board or substrate 300 (FIG. 3) in a relationship wherein I/O pads/contacts 230 and 232 are coupled via strips 231 to the respective I/O contact lines 303 and 304 on printed circuit board 300 and through-holes 201, 202, 203, 204, and 205 are oriented and extend in a direction generally normal to the top surface 302 of the printed circuit board 300.

These features of filter embodiment 200 with shield 400 as shown in FIG. 2 afford and provide the same advantages as described above with respect to filter/resonator embodiment 100 and thus the discussion thereof is incorporated herein by reference.

FIGS. 4 and 5 are frequency response graphs showing the actual measured low band and high band performance characteristics of both a prior art filter wherein the input/output pads are located on one of the side faces of the filter block (the graph line generally designated 500) and the resonator/filter in accordance with the present invention (the dotted graph line generally designated 600). FIG. 4 compares the performance of a prior art filter with filter embodiment 100 while FIG. 5 compares the performance of a prior art filter with filter embodiment 200. In both cases, the graphs depict the improved attenuation of the filters of the present invention outside the respective passbands of the filters.

Numerous variations and modifications of the embodiment described above may be effected without departing from the spirit and scope of the novel features of the invention. No limitations with respect to the specific module illustrated herein are intended or should be inferred.

What is claimed is:

1. A dielectric monoblock filter comprising:
    a block of dielectric material having at least top and bottom surfaces and side surfaces extending therebetween in a relationship generally normal to said top and bottom surfaces;
    at least a first region of conductive material on the top surface of said block;
    at least a second region of conductive material on the bottom surface of said block defining at least a first input/output contact;
    at least one through-hole extending between the top and bottom surfaces of said block in a relationship generally normal to said top and bottom surfaces of said block; and
    a transmission line between and electrically interconnecting said at least first and second regions of conductive material, said transmission line comprising a strip of conductive material extending along one of the side surfaces of said block between said at least first and second regions.

2. The filter of claim 1 wherein said block defines a front side surface and said strip of conductive material extends along said front side surface between said at least first and second regions.

3. The filter of claim 1 wherein said block defines an end side surface and said strip of conductive material extends along said end side surface between said at least first and second regions.

4. A resonator device adapted to be attached to the surface of a circuit board or substrate comprising:
    a block of dielectric material defined by top, bottom, and side surfaces including a first region of conductive material on said top surface of said block of dielectric material;
    a second region of conductive material on said bottom surface of said block of dielectric material defining an input/output contact for capacitively electrically coupling said resonator device to the board or substrate;
    at least one resonator defined by at least one through-hole extending between the top and bottom surfaces of said block, said at least one through-hole defining and being oriented in a relationship generally normal to the surface of the circuit board when said resonator device is attached thereto; and
    a conductive transmission line extending between and interconnecting said first and second regions of conductive material, said transmission line comprising a strip of conductive material extending along one of said side surfaces of said block between said first region of conductive material on said top surface and said input/output contact on said bottom surface.

5. The resonator device of claim 4 wherein said block defines an end side surface and said transmission line extends along said end side surface.

6. The resonator device of claim 4 wherein said block defines a front side surface and said transmission line extends along said front side surface of said block.

7. A dielectric monoblock filter comprising:
    a block of dielectric material having at least top and bottom surfaces and side surfaces extending therebetween in a relationship generally normal to said top and bottom surfaces;
    a plurality of through-holes extending through said block between said top and bottom surfaces in a relationship generally normal to said top and bottom surfaces of said block and terminating in respective apertures in said top and bottom surfaces respectively;
    at least one first region of conductive material surrounding selected ones of said apertures defined in said top surface;
    at least a second pair of second regions of conductive material defined on said bottom surface defining respective input/output contacts; and
    at least a pair of transmission lines between and electrically interconnecting said at least one first region of conductive material and said at least a second pair of second regions of conductive material said at least a pair of transmission lines being defined by a pair of strips of conductive material extending along the exterior of said side surfaces between said top surface and said respective input/output contacts on said bottom surface.

8. The dielectric monoblock filter of claim 7 wherein said block defines a front side surface and said pair of strips of conductive material extend along the exterior of said front side surface in spaced-apart and parallel relationship.

9. The dielectric monoblock filter of claim 7 wherein said block defines a pair of opposed end side surfaces and said pair of strips of conductive material extend respectively along the exterior of said opposed end side surfaces in a diametrically opposed relationship.

* * * * *